United States Patent [19]

Ohkase et al.

[11] Patent Number: 4,938,691
[45] Date of Patent: Jul. 3, 1990

[54] HEAT-TREATING APPARATUS

[75] Inventors: Wataru Ohkase; Ken Nakao, both of Sagamihara; Seishiro Sato, Machida, all of Japan

[73] Assignee: Tel Sagami Limited, Kanagawa, Japan

[21] Appl. No.: 272,415

[22] Filed: Nov. 17, 1988

[30] Foreign Application Priority Data

Nov. 17, 1987 [JP] Japan ............................ 62-290164
Nov. 17, 1987 [JP] Japan ............................ 62-290165

[51] Int. Cl.$^5$ .................. F27D 3/00; F27D 3/12; F27D 5/00; B65G 69/00
[52] U.S. Cl. ........................... 432/239; 432/253; 432/11; 432/241; 414/152; 414/156; 414/172
[58] Field of Search ............... 432/241, 239, 153, 253, 432/5, 6, 11, 205, 209; 414/152, 156, 172

[56] References Cited

U.S. PATENT DOCUMENTS

| | | | |
|---|---|---|---|
| 4,669,938 | 6/1987 | Hayward | 432/253 |
| 4,738,618 | 4/1988 | Massey et al. | 432/207 |
| 4,775,317 | 10/1988 | Schülke et al. | 432/241 |
| 4,828,490 | 5/1989 | Indig | 432/241 |

FOREIGN PATENT DOCUMENTS 61-183525 11/1986 Japan.

Primary Examiner—Henry A. Bennet
Assistant Examiner—Christopher B. Kilner
Attorney, Agent, or Firm—Oblon, Spivak, McClelland, Maier, Neustadt

[57] ABSTRACT

A heat-treating apparatus includes a furnace for heat-treating wafers, installed so as to set its longitudinal direction vertically and having an opening which is formed in its lower end so as to allow a boat having semiconductor wafers mounted thereon to be loaded, a heat-insulating cylinder on which the boat is placed and which is adapted to keep the boat hot, a lifting unit for lifting and loading the boat and the heat-insulating cylinder into the furnace, and for lowering and unloading them from the furnace, a moving unit for pivoting the heat-insulating cylinder and retracting the cylinder from below the boat, and a handler unit for supporting and vertically moving the boat. After the wafers are heat-treated, the boat is moved downward by the lifting unit. The heat-insulating cylinder is retracted from below the boat by the moving unit while the boat is supported by the handler unit. Subsequently, the boat is further lowered by the handler unit so as to completely remove the boat from the furnace.

17 Claims, 8 Drawing Sheets

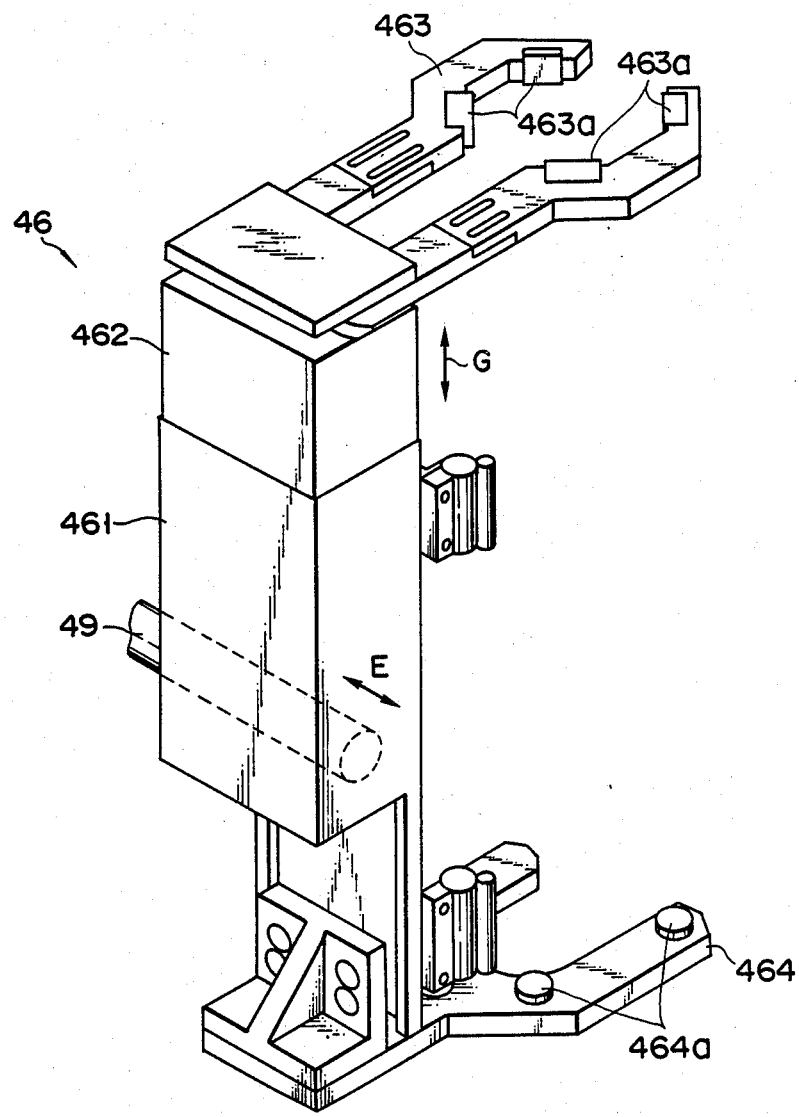
F I G. 3

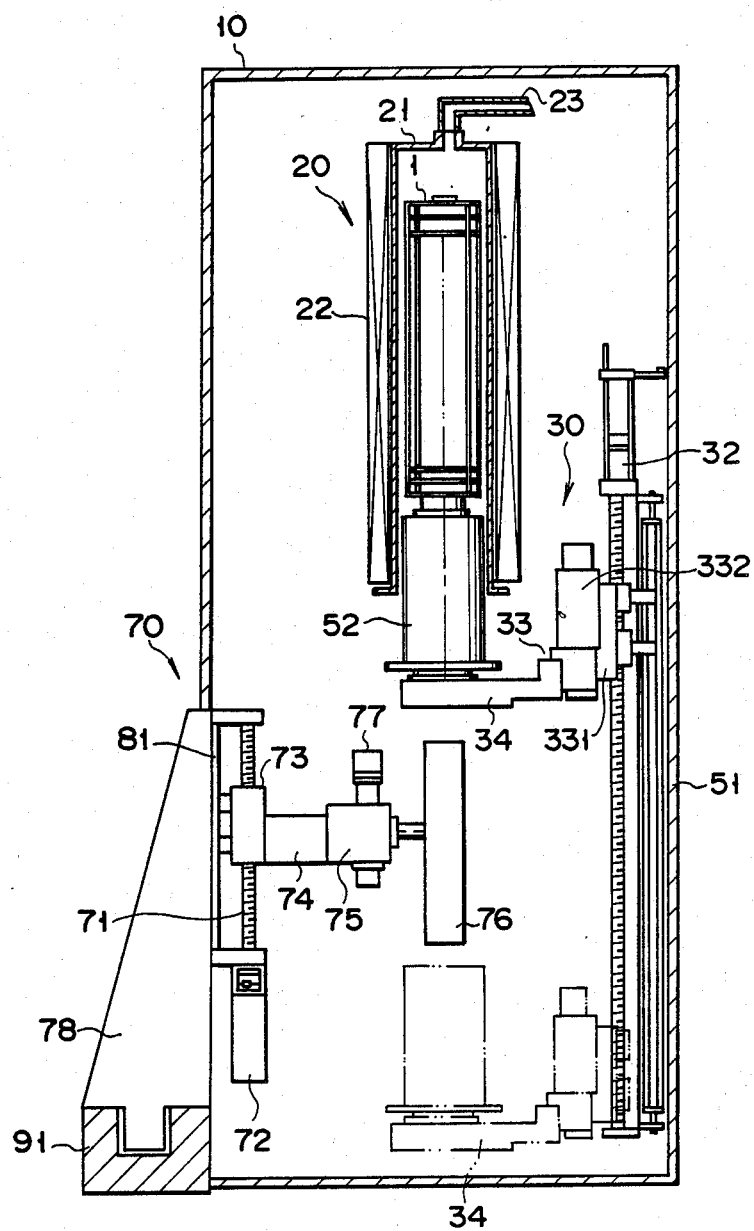
F I G. 5

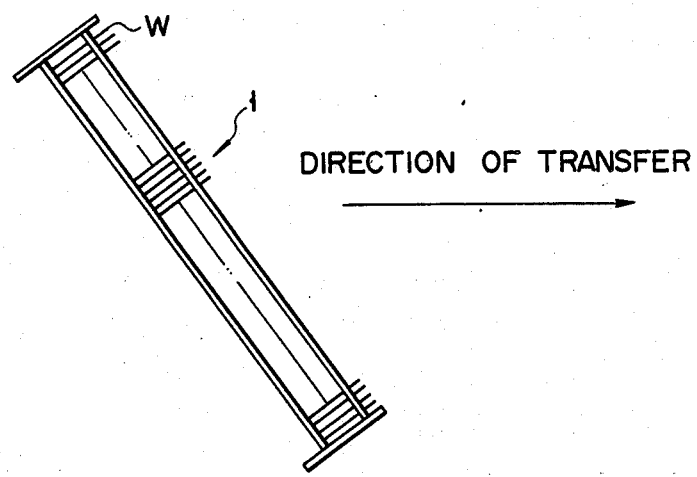
F I G. 8
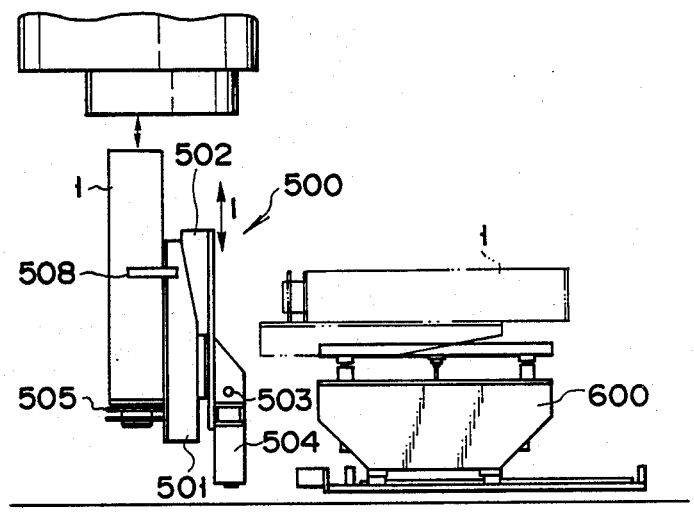
F I G. 9

HEAT-TREATING APPARATUS

BACKGROUND OF THE INVENTION

1. Field of the Invention

The present invention relates to a heat treating apparatus for heat-treating objects to be processed such as semiconductor wafers and, more particularly, to a heat-treating apparatus having a mechanism for loading/unloading the objects to be processed into/from an heat-treating furnace.

2. Description of the Related Art

When, for example, semiconductor wafers are to be heat-treated for oxidation, diffusion, or the like, a plurality of semiconductor wafers, for example 150, are mounted on a quartz boat, and the boat is loaded into a heat-treating furnace to be heat-treated. After heat-treating is completed, the quartz boat on which the semiconductor wafers are mounted is unloaded from the furnace and transferred to a wafer exchange position.

Horizontal and vertical type heat-treating furnaces are used for the heat-treating process. Vertical type furnaces are widely used for the following reasons:

In a heat-treating process, a deposit often adheres to the boat and the interior of the furnace. Therefore, when a horizontal type furnace in which a boat is horizontally loaded/unloaded by an open-side fork is used, the fork may be brought into contact with the deposit which has adhered to the interior of the furnace due to weight of fork, and hence the deposit may drop from the interior surface of the furnace. If the deposit drops in this manner, the dropped deposit may undesirably adhere to a semiconductor wafer as an impurity.

In contrast to this, in a vertical type furnace, since a boat is loaded/unloaded by vertically moving the boat without using a fork, the boat can be loaded/unloaded without bringing the boat into contact with deposits in the furnace. Therefore, the abovedescribed problem does not occur.

When wafers are heat-treated by the vertical type furnace, boats having various lengths are used depending on the number of wafers to be heat-treated. As described above, however, since a boat is loaded/unloaded from the furnace body, the apparatus is required to have a height corresponding to at least the total height of the furnace body, the heat-insulating cylinder placed under the boat, and the length of the boat. Therefore, when the height of an installation place is limited, a long boat cannot be used.

Each boat used for heat-treating includes, for examples, four parallel support rods each having a plurality of grooves formed at predetermined intervals, in which a plurality of semiconductor wafers are vertically supported. In the vertical type furnace, while these support rods are vertically set (i.e., wafers are horizontally set), the boat is loaded into the furnace body. The boat is unloaded from the furnace body in the same manner.

The wafers are mounted on the boat at a wafer transfer position which is located in a different area from the heat-treating furnace. Therefore, the boat with the wafers mounted thereon is transferred from this position to the location of the furnace.

Since the boat is loaded into the furnace with the support rods vertically set, as described above, the boat is transferred with the support rods vertically set.

SUMMARY OF THE INVENTION

It is an object of the present invention to provide a heat-treating apparatus comprising a vertical type heat-treating furnace, which can heat-treat objects to be processed regardless of the length of a boat member to be inserted into the furnace even if the height of the heat-treating furnace is limited.

It is another object of the present invention to provide a heat-treating apparatus which can stably transfer objects to be processed to and from a heat-treating furnace and can prevent adhesion of dust to the objects to be processed.

According to an aspect of the present invention, there is provided a heat-treating apparatus comprising: a furnace, installed so as to set a longitudinal direction thereof vertically and having an opening which is formed in a lower end thereof to allow boat mounting objects to be heat-treated at predetermined intervals to be loaded therein, for heat-treating said objects; a heat-insulating member to support said boat thereon, for keeping said objects hot when said boat is loaded in the furnace and the objects are heat-treated; lifting/lowering means for lifting the heat-insulting member, with the boat supported thereon, to load the boat and the heat-insulating member into the furnace; and for lowering the heat-insulating member to unload the boat and the insulating member from the furnace, moving means for moving the heat-insulating member from below the boat; and handling means for supporting and vertically moving the boat.

According to another aspect of the present invention, there is provided a heat-treating apparatus for heat-treating objects to be heat-treated arranged on a boat perpendicularly with respect to the longitudinal direction of the boat, comprising: a furnace for heat-treating the objects, the boat being loaded into the furnace; loading/unloading means for loading/unloading the boat into/from the furnace; boat moving means for holding the boat and moving the boat from below the furnace, or moving the boat to a position below the furnace; and transfer means for transferring the boat to/from the heat-treating apparatus while holding the boat at an angle other than vertical, the boat moving means being fixed to the transfer means.

BRIEF DESCRIPTION OF THE DRAWINGS

Various other objects, features and attendant advantages of the present invention will be more fully appreciated as the same becomes better understood from the following detailed description when considered in connection with the accompanying drawings in which like reference characters designate like or corresponding parts throughout the several views and wherein:

FIG. 3 is a perspective view of a handler unit;

FIG. 5 is a sectional view showing a heat-treating apparatus according to another embodiment of the present invention;

FIG. 8 is a view illustrating a preferably tilted boat when it is transferred; and FIG. 9 is a schematic view showing an arrangement of a modification of the handler unit.

DESCRIPTION OF THE PREFERRED EMBODIMENTS

Embodiments of the present invention will be described in detail below with reference to the accompanying drawings. In the embodiments, semiconductor wafers are used as objects to be processed.

Figure 1:
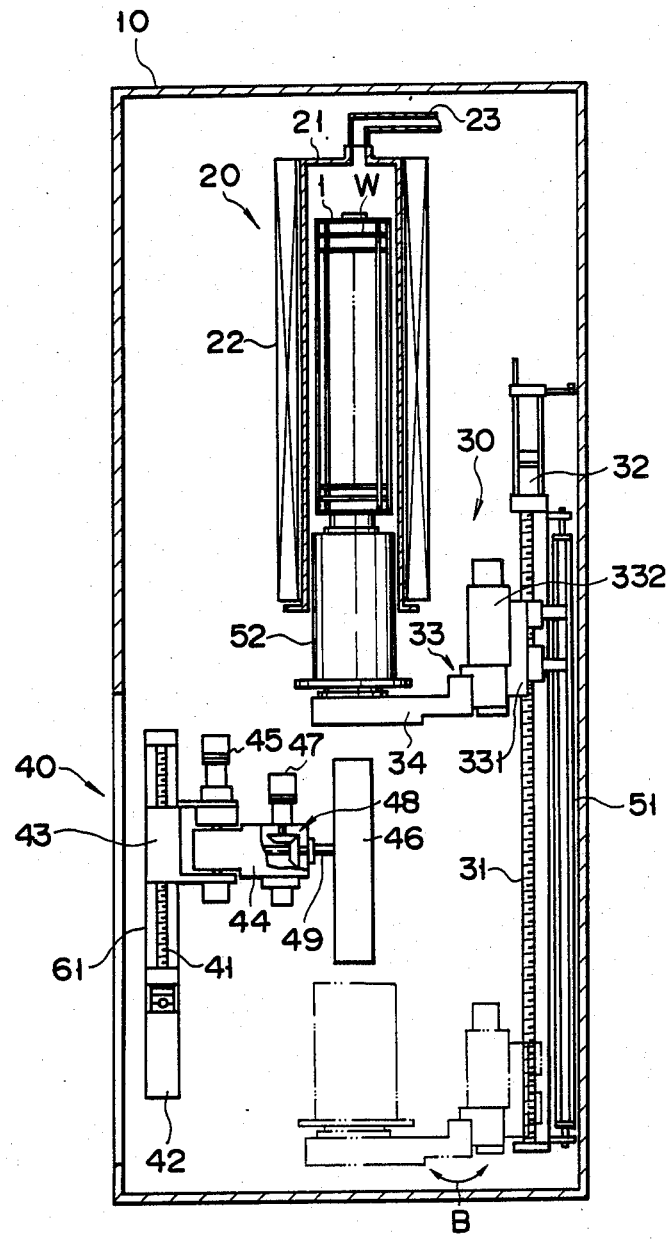
FIG. 1 is a sectional view showing a heat-treating apparatus according to an embodiment of the present invention.

FIG. 1 is a sectional view showing a heat-treating apparatus according to an embodiment of the present invention. As shown in FIG. 1, this heat-treating apparatus comprises housing 10, heat-treating furnace 20, arranged in an upper portion in housing 10, for heat-treating semiconductor wafers W mounted on boat 1 (to be described later), lifting unit 30 for loading/unloading boat 1 into/from furnace 20, and handler unit 40 for receiving boat 1 and transferring it outside housing 10.

Heat-treating furnace 20 comprises cylindrical process tube 21 arranged therein with its shaft set vertically, and heater 22 arranged around tube 21. Pipe 23 is connected to the upper end of tube 21 so as to supply an atmospheric gas into tube 21. When heat-treating is to be performed, boat 1 is loaded into process tube 21 from below.

Lifting unit 30 comprises ball screw 31 extending vertically, motor 32 for rotating ball screw 31, moving portion 33 which is screwed on ball screw 31 and guided by guide member 51 so as to be vertically moved, and support member 34, pivotally arranged on a lower portion of moving portion 33, for supporting heat-insulating cylinder 52 (to be described later). Boat 1 is mounted on heat-insulating cylinder 52 supported on support member 34. Cylinder 52 is for securing a soaking area of process tube 21 during heat-treating and preventing gas from escaping from the lower opening of tube 21. Moving portion 33, support member 34, and heat-insulating cylinder 52 stand by at the position indicated by an alternate long and short dashed line in FIG. 1. When moving portion 33 is moved upward by rotating ball screw 31 using motor 32, cylinder 52 and boat 1 are loaded into tube 21. When heat-treating is completed, moving portion 33, support member 34, and heat-insulating cylinder 52 are returned to the position indicated by the alternate long and two short dashed line in FIG. 1. Moving portion 33 includes support portion 331 supported by ball screw 31, and motor 332 coupled to support member 34. When support member 34 is located in the retracted position indicated by the alternate long and two short dashed line, support member 34 is horizontally pivoted by motor 332.

Figure 2:
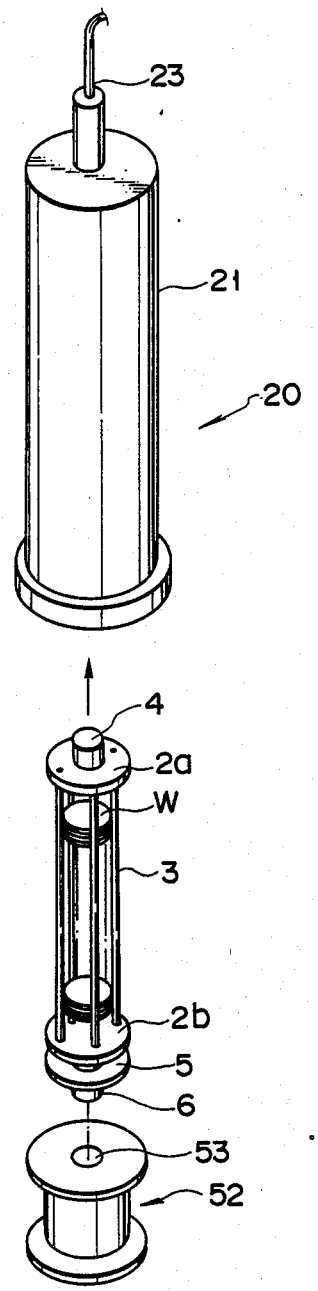
FIG. 2 is a view illustrating a process tube, a boat, and a heat-insulating unit.

Boat 1 is made of quartz, and comprises end plates 2a and 2b arranged at both ends, and four support rods 3 for coupling end plates 2a and 2b to each other, as shown in FIG. 2. Each support rod 3 has a plurality of grooves (not shown) formed at equal intervals so as to align/support a plurality of wafers. Upper pin 4 to be chucked by a handler (to be described later) is formed on end plate 2a of boat 1, which becomes an upper end when boat 1 is loaded into process tube 21. Flange 5 is formed outside end plate 2b such that it is separated from upper pin 4. Pin 6 is formed on the lower surface of flange 5. Pin 6 is fitted in hole 53 formed in the upper surface of heat-insulating cylinder 52 so that boat 1 is vertically supported by cylinder 52.

Handler unit 40 is located to oppose lifting unit 30 through heat-treating furnace 20. Handler unit 40 comprises ball screw 41 extending vertically, motor 42 for rotating ball screw 41, moving portion 43 which is screwed on ball screw 41 and guided by guide member 61 so as to be moved vertically, horizontal pivot portion 44 which is arranged on moving portion 43 so as to be pivoted horizontally, motor 45 for pivoting horizontal pivot portion 44, handler 46, arranged on a distal end portion of horizontal pivot portion 44 so as to be vertically pivoted, for holding and moving boat 1 when boat 1 is unloaded from furnace 20, and motor 47 for pivoting handler 46. Note that rotation of motor 46 is transmitted to rotary shaft 49 of handler 46 by helical gear mechanism 48.

With handler unit 40 having such an arrangement, handler 46 can be moved vertically, rotated in a vertical plane, and can be pivoted around the shaft of motor 45.

As shown in FIG. 3, handler 46 comprises main body 461, extendable portion 462 which is arranged on the upper end of main body 461 and is freely extendable/retractable, boat clamp arm 463, arranged on extendable portion 462, for clamping boat 1, and boat table 464 which is arranged on the lower end of main body 461 and on which boat 1 is mounted. Main body 461 is attached to rotary shaft 49 so as to be moved in a direction indicated by arrow E, and can be detached from rotary shaft 49.

Boat table 464 has projections 464a which are brought into contact with end plate 2b of boat 1 when boat 1 is mounted. Like boat 1, projections 464a are also made of quartz.

Boat clamp arm 463 is designed to be opened/closed by a driving system (not shown). Four clamp pawls 463a for clamping pin 4 of boat 1 described above are formed on the inner surfaces of clamp arm 463. When boat 1 is mounted on table 464 described above, clamp arm 463 is closed, and clamp pawls 463a clamp pin 4. Clamp pawls 463a are also made of quartz.

An operation of the heat-treating apparatus arranged in this manner will be described below with reference to FIG. 2 and FIGS. 4A to 4C.

Boat 1 having a plurality of wafers mounted thereon is placed on heat-insulating cylinder 52 loaded at the position indicated by the alternate long and two short dashed line in FIG. 1. Motor 32 is driven in this state to move portion 33 upward and load boat 1 and cylinder 52 into process tube 21 in heat-treating furnace 20. Subsequently, power is supplied to heater 22 to start heat-treating.

After heat-treating, motor 32 is driven to rotate ball screw 31 and lower moving portion 33, support member 34, and heat-insulating cylinder 52 to the position indicated by the alternate long and two short dashed line.

Figures 4A, 4B:
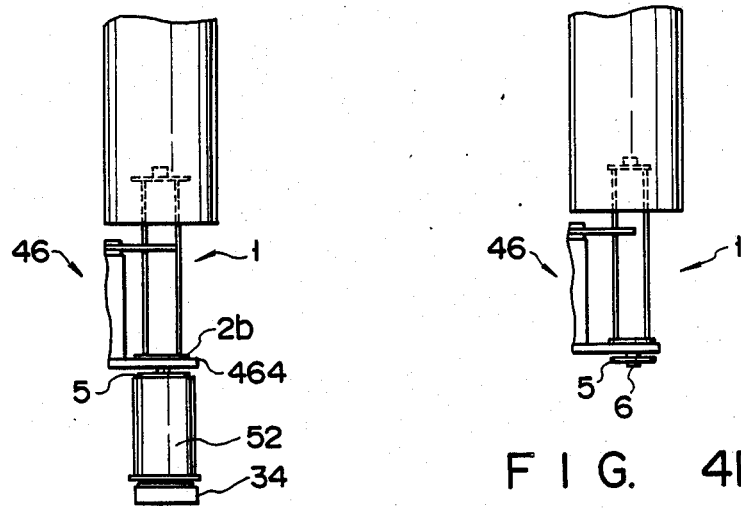
FIGS. 4A to 4C are views illustrating an operation for unloading the boat.

In each case, the length of boat 1 varies depending on the number of semiconductor wafers to be stored. However, as shown in FIG. 4A, when a boat which is too long is used, even if moving portion 33 is lowered to the lowest possible position indicated by the alternate long and two short dashed line, an upper portion of boat 1 is still located inside process tube 21. Therefore, in the conventional apparatus, such a long boat cannot be unloaded from process tube 21.

In the embodiment, however, boat 1 can be unloaded as follows. While moving portion 33 of lifting unit 30 is located at the lowest position indicated by the alternate long and two short dashed line as shown in FIG. 4A, horizontal pivot portion 44 is pivoted by motor 45, and boat table 464 of the handler is inserted between end plate 2b of boat 1 and flange 5. In this case, handler 46 is shortened to the minimum length by retracting the extendable portion 462 of handler 46. This operation prevents clamp arm 463 from colliding with annealing furnace 20.

Subsequently, table 464 is moved slightly upward by driving motor 42 of handler unit 40, or heat-insulating cylinder 52 is slightly moved downward by driving motor 32 of lifting unit 30, so that lower pin 6 of boat 1 is pulled out from hole 53 of cylinder 52. Thereafter, when support member 34 is horizontally pivoted by driving motor 332 of moving portion 33, heat-insulating cylinder 52 is separated from immediately below boat 1 (FIG. 4B), so that, no obstacle is present below boat 1.

Figure 4C:
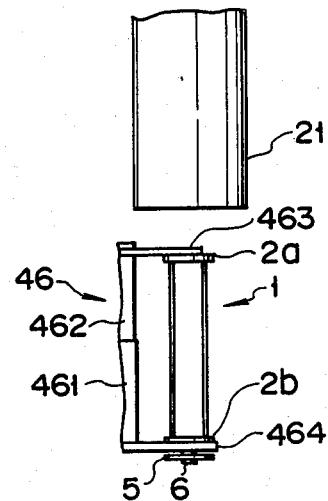

Handler 46 is lowered in this state by motor 43, and completely unloads boat 1 outside process tube 21. Then, extendable portion 462 of handler 46 is extended upward, and pin 4 of boat 1 is clamped by clamp arm 463 (FIG. 4C).

Subsequently, horizontal pivot portion 44 is pivoted by motor 45 so as to retract boat 1 held by handler 46 from immediately below heat-treating furnace 20. Handler 46 is then rotated by motor 47 to set boat 1 in a horizontal state. Horizontal pivot portion 44 is further pivoted to transfer boat 1 outside housing 10 and hand it to a transfer unit (not shown). Thereafter, this transfer unit is transferred to a position for the next process. Note that since boat 1 is clamped by boat clamp arm 463 in this case, boat 1 is reliably held by handler 46. For this reason, boat 1 cannot slip from handler 46 even during the pivotal movement of boat 1 described above.

According to the embodiment described above, even if boat 1 is long, and part of boat 1 is left in the process tube when support member 34 is moved to the lowest position, since the heat-insulating cylinder can be easily removed from below boat 1, boat 1 can be easily unloaded from heat-treating furnace 20. Therefore, when the height of housing 10 must be limited, a long boat can be used.

Note that handler unit 40 can not only unload boat 1 from heat-treating furnace 20 as described above, but also load boat 1 in furnace 20 in the reverse sequence.

Another embodiment of the present invention will be described below. This embodiment discloses a heat-treating apparatus in which a handler unit is arranged on a transfer unit for transferring a boat. FIG. 5 is a sectional view showing a heat-treating apparatus according to another embodiment of the present invention. The same reference numerals in FIG. 1 denote the same parts as in FIG. 1, and a description thereof will be omitted. Similar to handler unit 40 in FIG. 1, handler unit 70 in this heat-treating apparatus is located to oppose lifting unit 30 through annealing furnace 20. Handler 70 comprises ball screw 71 extending vertically, motor 72 for rotating ball screw 71, moving portion 73 which is screwed on ball screw 71 and is guided by guide member 81 to be moved vertically, horizontal portion 74 fixed to moving portion 73 and extending horizontally, moving portion 75 arranged so as to be moved horizontally along horizontal portion 74, handler 76 having the same structure as that of handler 46, motor 77 for driving moving portion 75 and handler 76, and transfer portion 78 which supports ball screw 71 and guide member 81 and is moved along guide 301 of a transfer unit (to be described later). A clutch unit (not shown) is arranged in motor 77 so that motor 77 is connected to a rack and pinion mechanism when moving portion 75 is moved, and is connected to such a helical gear mechanism as described above when handler 76 is rotated.

In this heat-treating apparatus, boat 1 can be unloaded/loaded from/in furnace 20 in substantially the same manner as in the apparatus in FIG. 1. More specifically, in the apparatus in FIG. 1, boat 1 is retracted from immediately below furnace 20 by rotating handler 46 after boat 1 is taken out from furnace 20. This embodiment is different from the previous embodiment only in that handler 76 is linearly moved to be retracted.

Figure 6:
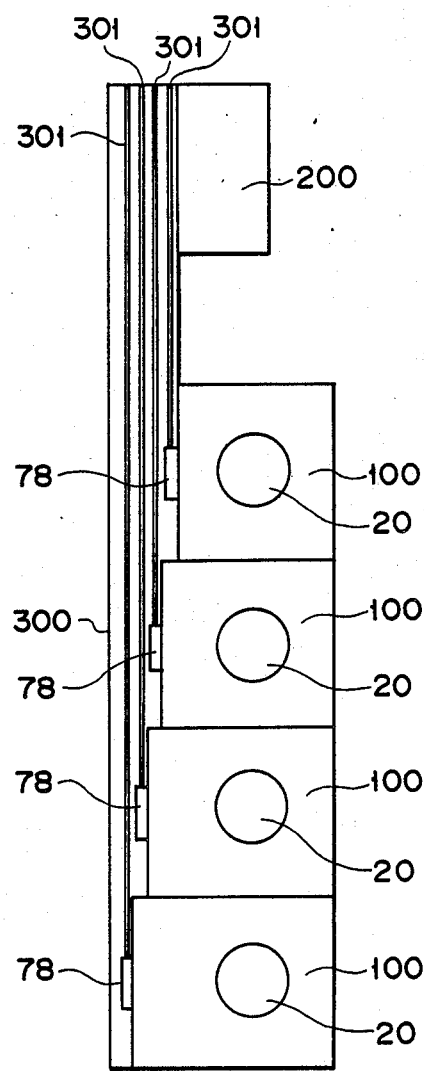
FIG. 6 is a schematic view showing an arrangement of a system to which the heat-treating furnace in FIG. 5 is applied.

The transfer operation of a boat will be described below. The annealer in this embodiment is incorporated in, e.g., a system as shown in FIG. 6. As shown in FIG. 6, this system comprises four heat-treating apparatus 100, wafer exchange unit 200 for detaching wafers from a boat, and transfer unit 300 for transferring the boat between annealers 100 and wafer exchange unit 200.

Transfer unit 300 comprises four guides along which transfer portion 78 of each heat-treating apparatus 100 is moved. Each transfer portion 78 is transferred to wafer exchange unit 200 by a motor and a belt (neither of which are shown) along guide 301. Upon completion of an exchange operation, each transfer portion 78 is transferred from unit 200 to annealers 100.

Figure 7A:
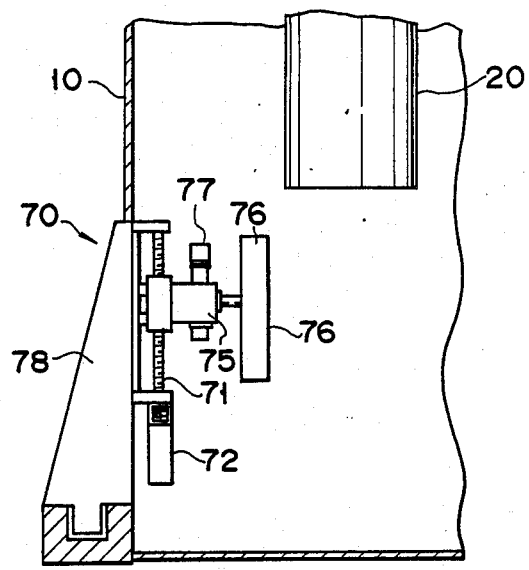
FIGS. 7A and 7B are views illustrating an operation for transferring the boat.
Figure 7B:
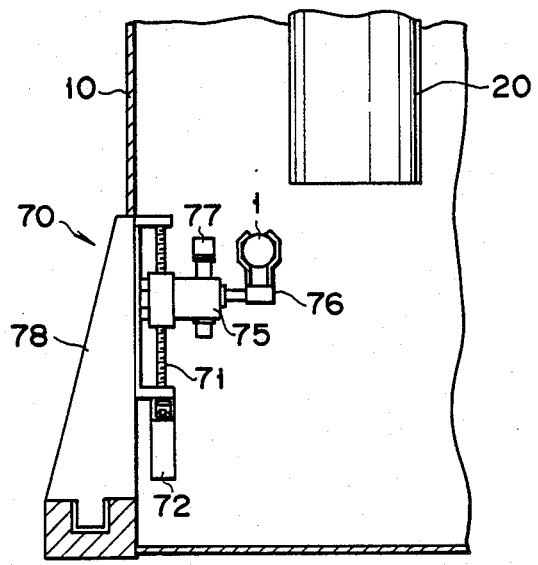

When boat 1 is to be transferred, boat 1 is taken out from heat-treating furnace 20 by clamping it using handler 76. Moving portion 75 is then linearly moved toward transfer portion 78 by motor 77, thereby moving boat 1 from a position immediately below furnace 20, as shown in FIG. 7A. Subsequently, handler 76 is rotated by motor 77 so as to set boat 1 in a horizontal state as shown in FIG. 7B. By setting boat 1 in the horizontal state in this manner, wafers stored in boat 1 can be held in the grooves of boat 1 in a vertical state.

When transfer unit 300 is driven in such a state, transfer portion 78 is moved along guide 301, and hence boat 1 is transferred to wafer exchange unit 200.

Since boat 1 is transferred in a horizontal state in this manner, each wafer is reliably held in place in a corresponding groove of boat 1 by its own weight, as opposed to a conventional apparatus wherein boat 1 is vertically transferred, and each wafer can be stably supported during transfer of boat 1. Therefore, this arrangement can reliably prevent wafers from dropping from a boat. In addition, chipping of wafers can be considerably reduced.

When boat 1 reaches wafer exchange unit 200, the motor for transfer unit 300 stops, halting transfer portion 78 which holds boat 1. Then, the wafers mounted on boat 1 are moved to a carrier case (not shown) by unit 200, and wafers in another carrier case are mounted on boat 1. Subsequently, boat 1 held by transfer portion 78 is transferred to heat-treating apparatus 100 by transfer unit 300. In this case, too, the same effects as described above can be obtained by transferring boat 1 horizontally.

Single transfer unit 300 can be commonly used by four heat-treating apparatus 100 by performing such an operation using staggered timing with respect to the four heat-treating apparatus 100. With this arrangement, a small system can be realized.

In the above embodiment, boat 1 is horizontally transferred. However, the present invention is not limited to this. If boat 1 is transferred while it is supported so as to be tilted with respect to a transfer direction as shown in FIG. 8, excellent effects can be obtained. More specifically, movement of each wafer can be considerably reduced compared with the case wherein boat 1 is transferred vertically, and the effect of preventing chipping especially can be greatly enhanced. In addition, by tilting boat 1 in such a manner, a force acting on the wafers when boat 1 is transferred is applied in a direction to urge the wafers against the grooves of boat 1, and boat 1 can be transferred while the wafers are in close contact with the grooves. Therefore, dropping and chipping of wafers can be prevented. In each case, the wafer transfer direction when boat 1 is transferred from heat-treating apparatus 100 to wafer exchange unit 200 is reversed when boat 1 is reversely transferred. Therefore, the tilt direction of boat 1 is preferably reversed in accordance with a change in transfer direction such that boat 1 is tilted with respect to each transfer direction in the same manner as shown in FIG. 8. In any case, as long as boat 1 is not transferred vertically, the above-described effects can be obtained.

Note that the present invention is not limited to the two embodiments described above. Various changes and modifications can be made within the scope and spirit of the invention.

For example, the pivot mechanism is used as a mechanism for moving heat-insulating cylinder 52. However, the present invention is not limited to this, and another moving mechanism such as a mechanism for linear movement may be employed.

As the handler unit, any device can be used as long as it can hold and move boat 1 vertically. However, the device is preferably capable of changing the direction of boat 1 as in the embodiments.

A handler unit as shown in FIG. 9 can be used as a modification of the handler unit. Handler 500 in FIG. 9 comprises clamp arm 508 for supporting an intermediate portion of boat 1, handler 501 for holding boat 1, support member 502 for supporting handler 501 so as to allow handler 501 to move in a direction indicated by arrow I, second support member 504 for supporting support member 502 so as to allow support member 502 to be pivoted about support shaft 503, and table 505 which is fixed to an end portion of handler 501 and on which boat 1 is mounted. Handler 501 is linearly moved by a driver (not shown) along first support member 502 so as to cause first support member 502 to be pivoted about support shaft 503. Similar to handler unit 40 in FIG. 1, in this unit, handler 501 is lowered to completely unload boat 1 from the process tube after the heat-insulating cylinder is moved, and boat 1 is then pivoted about support shaft 503, thereby mounting boat 1 on transfer table 600 in a horizontal state. Although in FIG. 9 a lifting unit for boat 1 is omitted, the lifting unit can be arranged in the same manner as in the unit in FIG. 1.

FIG. 5 shows the system having a plurality of heat-treating apparatus. However, the present invention is not limited to this, and can be applied to a system having a single heat-treating apparatus. The transfer unit shown in FIG. 5 can be used in a case other than the case wherein it is used together with the handler unit. Therefore, the transfer unit can be used in the conventional vertical and horizontal type furnaces.

In addition, in the above embodiments, a boat having wafers mounted thereon is used as an object to be heat-treated. However, the present invention is also not limited to this.

What is claimed is:

1. A heat-treating apparatus comprising:
   a furnace, installed so as to set a longitudinal direction thereof vertically and having an opening which is formed in a lower end thereof to allow a boat mounting objects to be heat-treated at predetermined intervals to be loaded therein, for heat-treating said objects;
   heat-insulating member to support said boat thereon, for keeping said objects hot when said boat is loaded in said furnace and said objects are heat-treated;
   lifting/lowering means for lifting said heatinsulating member, with the boat supported thereon, to load said boat and said heat-insulating member into said furnace, and for lowering said heat-insulating member to unload said boat and said insulating member from said furnace;
   moving means for moving said heat-insulating member from below said boat; and
   handling means for supporting and vertically moving said boat.

2. A heat-treating apparatus according to claim 1, wherein said moving means includes a support portion for supporting said heat-insulating means to allow said heat-insulating means to be pivoted within a horizontal plane, and pivot means for pivoting said support portion.

3. A heat-treating apparatus according to claim 1, wherein said handling means includes a clamp member for clamping said boat, a support member for supporting said clamp member so as to allow said clamp member to be moved vertically, and driving means for vertically moving said support portion.

4. A heat-treating apparatus according to claim 3, wherein said handling means includes boat moving means for moving said boat clamped by said clamp member from below said furnace and for moving said boat to a position below said furnace.

5. A heat-treating apparatus according to claim 4, wherein said boat moving means includes a pivot support portion for supporting said clamp portion so as to allow said clamp portion to be pivoted within a horizontal plane, and driving means for pivoting said pivot support portion.

6. A heat-treating apparatus according to claim 4, wherein said boat moving means includes a guide member for allowing said clamp portion to be moved horizontally, and driving means for driving said clamp portion along said guide member.

7. A heat-treating apparatus according to claim 3, wherein said handling means includes rotating means for rotating said clamp portion within a vertical plane.

8. A heat-treating apparatus according to claim 1, further comprising transfer means for transferring said boat to/from said heat-treating apparatus while said object is supported by said handling means.

9. An annealer according to claim 8, wherein the objects are arranged perpendicularly to the longitudinal direction of said boat.

10. A heat-treating apparatus according to claim 9, wherein said transfer means includes a boat support member capable of supporting said boat at an angle other than vertically when said boat is transferred.

11. A heat-treating apparatus according to claim 10, wherein said transfer means includes rotating means for rotating said boat support member, thereby supporting said boat at an arbitrary angle other than vertically.

12. A heat-treating apparatus according to claim 1, wherein said furnace includes a process tube in which said boat is inserted, and a heater, arranged outside said process tube, for heating said objects.

13. A heat-treating apparatus according to claim 1, wherein said handling means includes moving means for vertically moving said object and for pivoting said object between a horizontal state and vertical state.

14. A heat-treating apparatus for heat-treating objects to be heat-treated arranged on a boat supported perpendicularly with respect to the longitudinal direction of said boat, comprising:
   a furnace for heat-treating the objects, said boat being loaded into said furnace;
   loading/unloading means for loading/unloading said boat into-from said furnace;
   boat moving means for holding said boat and moving said boat from below said furnace, or moving said boat to a position below said furnace; and
   transfer means for transferring said boat to/from said heat-treating apparatus while holding said boat at an angle other than vertically, said boat moving means being fixed to said transfer means, wherein said transfer means includes boat support means for rotatably supporting said boat moving means, and rotating means for rotating said boat support means so that said boat is supported at an angle other than vertically.

15. A heat-treating apparatus according to claim 14, wherein said transfer means transfers said boat in a horizontal state.

16. A heat-treating apparatus according to claim 14, wherein said transfer means transfers said boat while said boat is tilted such that a lower end thereof extends in a transfer direction.

17. A heat-treating system, comprising a plurality of heat treating apparatuses, each having a heat-treating furnace for heat-treating wafers which are supported on a boat perpendicular with respect to a longitudinal direction of said boat;
   loading/unloading means for loading/unloading said boat into or from said furnace;
   boat moving means for holding said boat and moving said boat from below said furnace or to a position below said furnace; and
   a transfer unit for transferring said moving means from said heat-treating apparatus to a position for another process, said transfer unit including boat support means for rotatably supporting said boat support means so that said boat is supported at an angle other than vertically.

* * * * *